United States Patent
Takita (10) Patent No.: US 7,598,781 B2
(45) Date of Patent: Oct. 6, 2009

(54) CAPACITIVE LOAD DRIVING DEVICE

(75) Inventor: Yutaka Takita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 33 days.

(21) Appl. No.: 11/878,792

(22) Filed: Jul. 26, 2007

(65) Prior Publication Data

US 2008/0088348 A1    Apr. 17, 2008

(30) Foreign Application Priority Data

Oct. 16, 2006    (JP)    .............................. 2006-281536

(51) Int. Cl.
*H03B 1/00*    (2006.01)
(52) U.S. Cl. .......................... 327/111; 327/436; 326/82
(58) Field of Classification Search ............. 326/82–83; 327/108–109, 436, 437, 494, 470, 482
See application file for complete search history.

(56) References Cited

U.S. PATENT DOCUMENTS 5,796,470 A    8/1998    Ueda
5,952,736 A *   9/1999    Matsubara .................. 307/106

FOREIGN PATENT DOCUMENTS

JP    47-037057    5/1972
JP    04-260089    9/1992
JP    2005-169737    6/2005

OTHER PUBLICATIONS

Aoki S et al: "Electrooptic Planar Deflector Switches With Thin-Film PLZT Active Elements" IEEE Journal of Selected Topics in Quantum Electronics, IEEE Service Center, Piscataway, NY, US, vol. 11, No. 2, Mar. 2005, pp. 422-430.*
A. Glebov, S. Aoki et al., "Electrooptic Planar Deflector Switches with Thin-Film PLTZ Active Elements", IEE Journal of Selected Topics in Quantum Electronics, vol. 11, No. 2, Mar. 2005; pp. 422-430.
P. Horowitz et al., "The Art of Electronics", $2^{nd}$ Edition, 1989, Schematic circuit of 741 Operational Amplifier; pp. 188-189.
Extended European Search Report issued in corresponding European Patent Application No. 07014663.4 on Apr. 18, 2008.

* cited by examiner

*Primary Examiner*—Long Nguyen
*Assistant Examiner*—Shikha Goyal
(74) *Attorney, Agent, or Firm*—Staas & Halsey LLP (57) ABSTRACT

A capacitive load driving device applies a multi-level voltage to a capacitive load to drive the capacitive load. In the capacitive load driving device, a voltage control signal generator unit generates a voltage control signal. A voltage amplifier unit amplifies a voltage of the voltage control signal. A current amplifier unit amplifies a current of an output of the voltage amplifier unit to perform charging of the capacitive load. A falling control signal generator unit generates a falling pulse having a predetermined pulse width when a width of falling of the voltage control signal exceeds a predetermined value. A switching unit performs discharging of the capacitive load in response to the falling pulse received.

2 Claims, 9 Drawing Sheets

CAPACITIVE LOAD DRIVING DEVICE

CROSS-REFERENCE TO RELATED APPLICATIONS

This application is based upon and claims the benefit of priority of Japanese patent application No. 2006-281536, filed on Oct. 16, 2006, the entire contents of which are herein incorporated by reference.

BACKGROUND OF THE INVENTION

1. Field of the Invention

This invention generally relates to a capacitive load driving device, and more particularly to a capacitive load driving device which applies a multi-level voltage to a capacitive load to drive the capacitive load.

2. Description of the Related Art

In an optical matrix switch, a multi-level high voltage is applied to an electro-optic effect device, and a refractive index of the electro-optic effect device is varied according to the applied voltage so that optical switching is carried out. The rise time and the fall time of the high-voltage pulse signal are set up to control the driving cycle of the optical matrix switch. High-speed switching is demanded for the optical matrix switch.

The electro-optic effect device is provided with the electrodes on both sides of the crystal. The electro-optic effect device is electrically regarded as a capacitor (or capacitive load), and a high voltage on the order of several hundred volts is applied between the electrodes.

Figure 1:
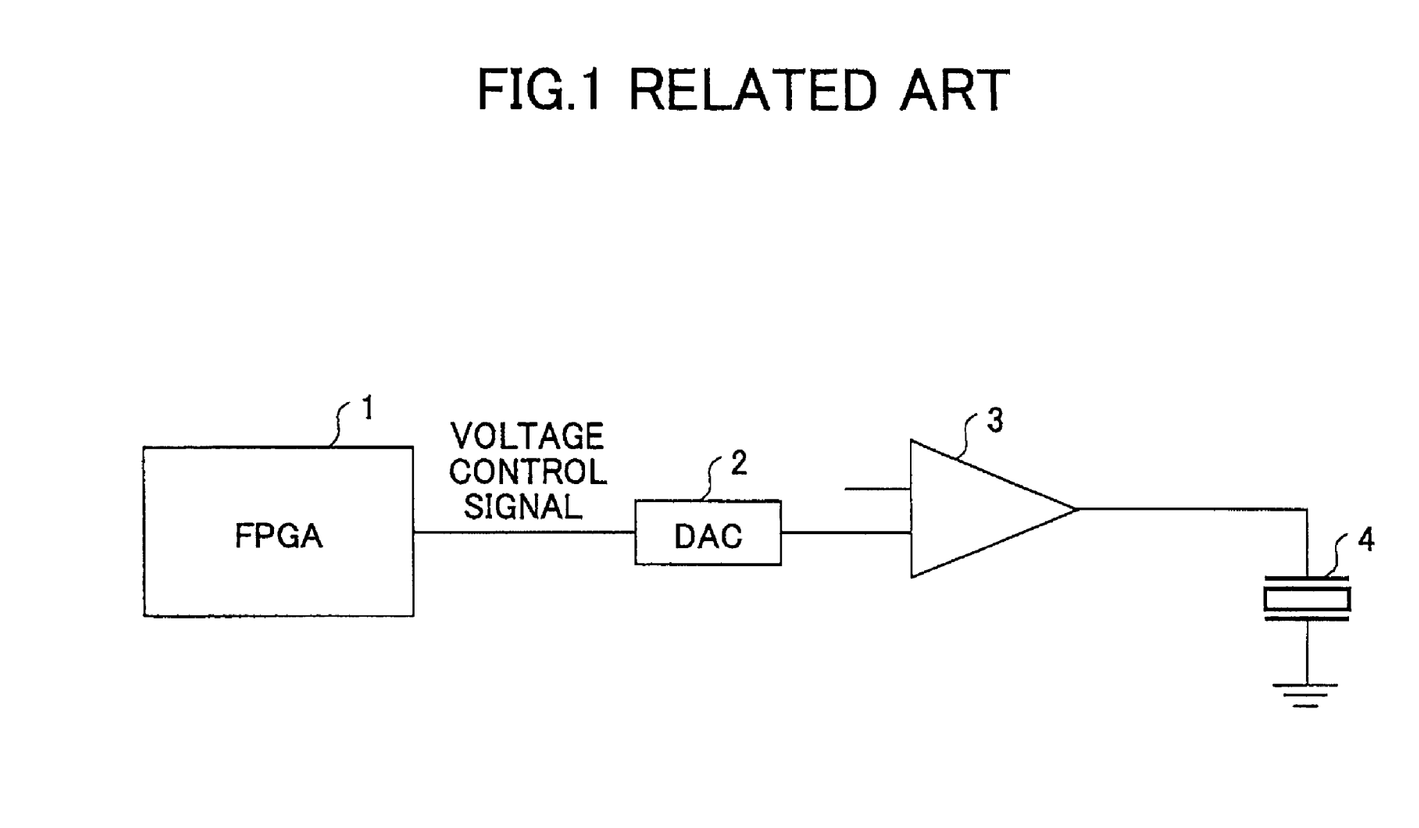
FIG. 1 is a diagram showing the composition of a conventional capacitive load driving device.

FIG. 1 shows the composition of a conventional capacitive load driving device. As shown in FIG. 1, a control signal generator unit 1 which is composed of an ASIC (application-specific integrated circuit), such as FPGA (field programmable gate array), outputs a digital voltage control signal. After the digital voltage control signal output from the control signal generator unit 1 is converted into an analog signal by a D/A converter (DAC) 2, the analog signal is supplied to a voltage amplifier 3, and the voltage of the analog signal is amplified by the voltage amplifier 3. The amplified voltage signal is supplied to one end of a capacitive load 4. The other end of the capacitive load 4 is grounded.

Figure 2:
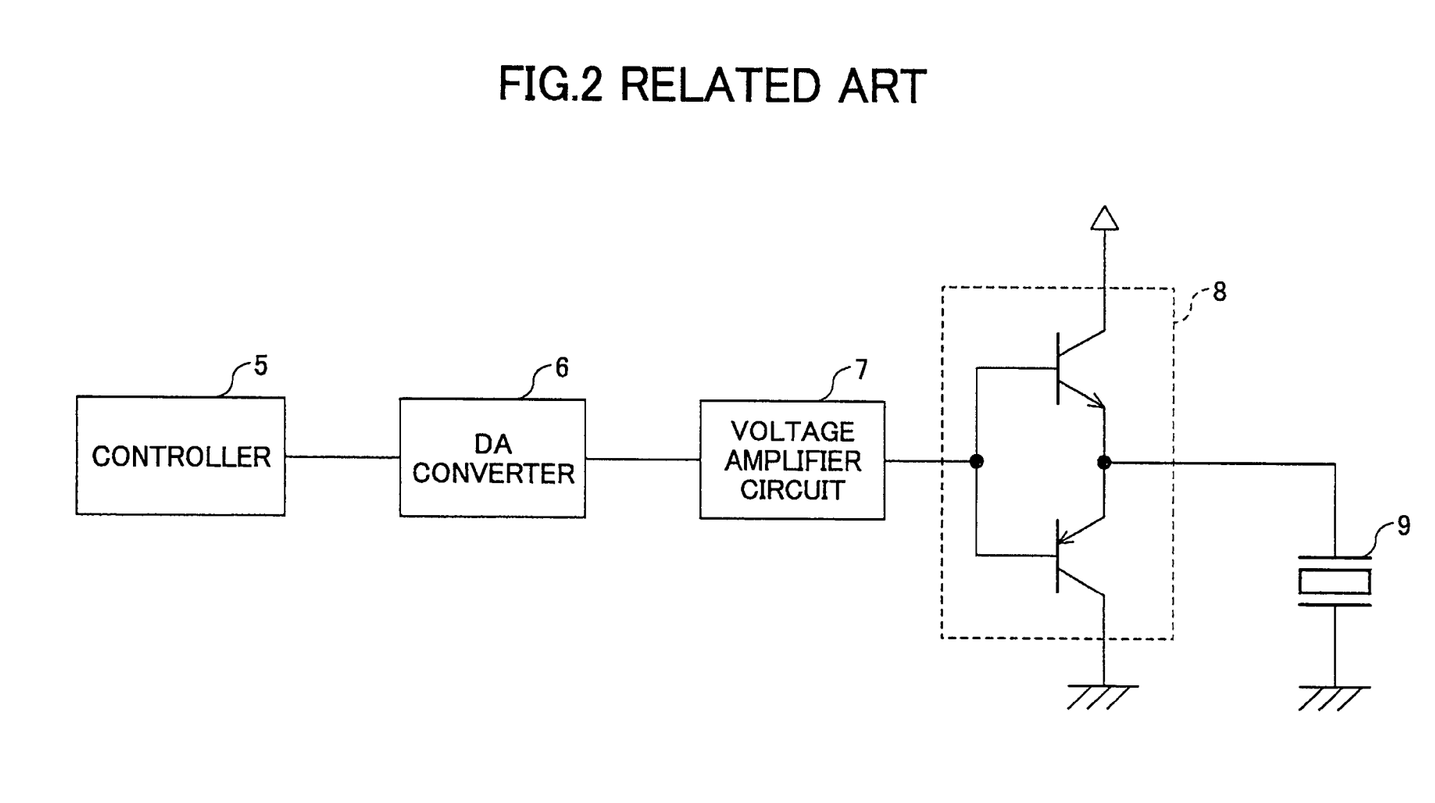
FIG. 2 is a diagram showing the composition of a conventional capacitive load driving device.

Japanese Laid-Open Patent Application No. 2005-169737 discloses a capacitive load driving device as shown in FIG. 2. In the conventional capacitive load driving device of FIG. 2, a drive waveform signal output from a controller 5 is converted into an analog signal by a D/A converter 6, and the voltage of the analog signal output from the D/A converter 6 is amplified by a voltage amplifier circuit 7. The current of the amplified voltage signal output from the voltage amplifier circuit 7 is amplified by a current amplifier circuit 8. The amplified current signal output from the current amplifier circuit 8 is supplied to a piezoelectric element 9 which is a capacitive load.

Japanese Laid-Open Patent Application No. 47-037057 discloses a capacitive load driving device wherein a first current switch and a second current switch are connected in series via a pair of diodes, and a capacitive load is connected to the middle point of the pair of diodes. In this capacitive load driving device, the potential of the junction point of the second current switch and the pair of diodes is raised beforehand when charging the capacitive load. And when discharging the capacitive load, the potential of the junction point of the first current switch and the pair of diodes is lowered beforehand.

Japanese Laid-Open Patent Application No. 04-260089 discloses a capacitive load driving device which is adapted to quickly perform charging and discharging of a capacitive load by changing the voltage between the terminals of the capacitive load with a first current value, and thereafter driving the capacitive load with a second current value larger than the first current value.

In the case of the conventional circuit of FIG. 1, it is necessary that the output impedance when the voltage of the voltage amplifier 3 is varied at high speed is about 10 kΩ, in order to apply a multi-level voltage ranging from 0V to 100V to the capacitive load 4 having an electrostatic capacitance of some nanofarads (nF) at high speed. The time constant which is equal to a product of the output impedance of the voltage amplifier 3 and the capacitance of the capacitive load 4 is on the order of several ten microseconds. For this reason, there is a difficulty in performing the variable control of the voltage applied to the capacitive load 4 at a very high speed on the microsecond order.

In the case of the conventional circuit of FIG. 2, the current of the amplified voltage signal output from the voltage amplifier circuit 7 is amplified by the current amplifier circuit 8, and the amplified current signal output from the current amplifier circuit 8 is supplied to the capacitive load (piezoelectric element) 9. Thus, charging of the capacitive load at high speed is possible.

However, in order to vary the multi-level voltage applied to the electro-optic effect device at high speed (the applied multi-level voltage ranging between 0V and 400V), discharging of the capacitive load must be performed at high speed in accordance with the falling edges of the applied voltage.

In the case of the conventional circuit of FIG. 2, the change of the applied voltage is limited to one pattern. However, in a case in which there are many patterns including a pattern for changing the applied voltage from 400V to 0V, a pattern for changing the applied voltage from 400V to 380V, and so on, it is difficult to control the discharging of the capacitive load in accordance with the changes of the applied voltage in a wider range at high speed.

SUMMARY OF THE INVENTION

According to one aspect of the invention, there is provided a novel and useful capacitive load driving device in which the above-described problems are eliminated.

According to one aspect of the invention, there is provided a capacitive load driving device which is adapted to control the discharging of the capacitive load in accordance with the changes of the applied voltage in a wide range, thereby carrying out the variable control of the multi-level voltage applied to the capacitive load at high speed.

In an embodiment of the invention which solves or reduces one or more of the above-mentioned problems, there is provided a capacitive load driving device which applies a multi-level voltage to a capacitive load to drive the capacitive load, the capacitive load driving device comprising: a voltage control signal generator unit generating a voltage control signal; a voltage amplifier unit amplifying a voltage of the voltage control signal; a current amplifier unit amplifying a current of an output of the voltage amplifier unit to perform charging of the capacitive load; a falling control signal generator unit generating a falling pulse with a predetermined pulse width when a width of falling of the voltage control signal exceeds a predetermined value; and a switching unit performing discharging of the capacitive load in response to the falling pulse received from the falling control signal generator unit.

The above-mentioned capacitive load driving device may be configured so that a positive thermistor is provided between the current amplifier unit and the capacitive load.

The above-mentioned capacitive load driving device may be configured so that the falling control signal generator unit comprises: a table unit which is provided so that a table is accessed with a digital value of a previously supplied voltage control signal and a digital value of a currently supplied voltage control signal, and a specific value is read from the table when a width of falling from the previously supplied voltage control signal value to the currently supplied voltage control signal value exceeds a predetermined value; and a pulse generator unit which generates a falling pulse when the specific value is read from the table.

The above-mentioned capacitive load driving device may be configured so that the falling control signal generator unit comprises: a differential unit which differentiates an analog voltage control signal to output a differential signal; a first transistor which is provided so that the first transistor is turned off when a negative polarity pulse of the differential signal is less than a predetermined value; and a second transistor which is turned on when the first transistor is turned off, to output a falling pulse.

The above-mentioned capacitive load driving device may be configured so that the differential unit comprises a time-constant adjusting unit adjusting a time constant.

The above-mentioned capacitive load driving device may be configured so that the capacitive load driving device further comprises a bias adjustment unit adjusting a bias of the first transistor.

The above-mentioned capacitive load driving device may be configured so that the capacitive load is an electro-optic effect device.

According to the embodiment of the invention, it is possible to control the discharging of the capacitive load in accordance with the changes of the applied voltage in a wide range, and the variable control of the multi-level voltage applied to the capacitive load can be carried out at high speed.

BRIEF DESCRIPTION OF THE DRAWINGS

Other objects, features and advantages of the present invention will become more apparent from the following detailed description when read in conjunction with the accompanying drawings.

DETAILED DESCRIPTION OF THE PREFERRED EMBODIMENTS

A description will now be given of an embodiment of the invention with reference to the accompanying drawings.

Figure 3:
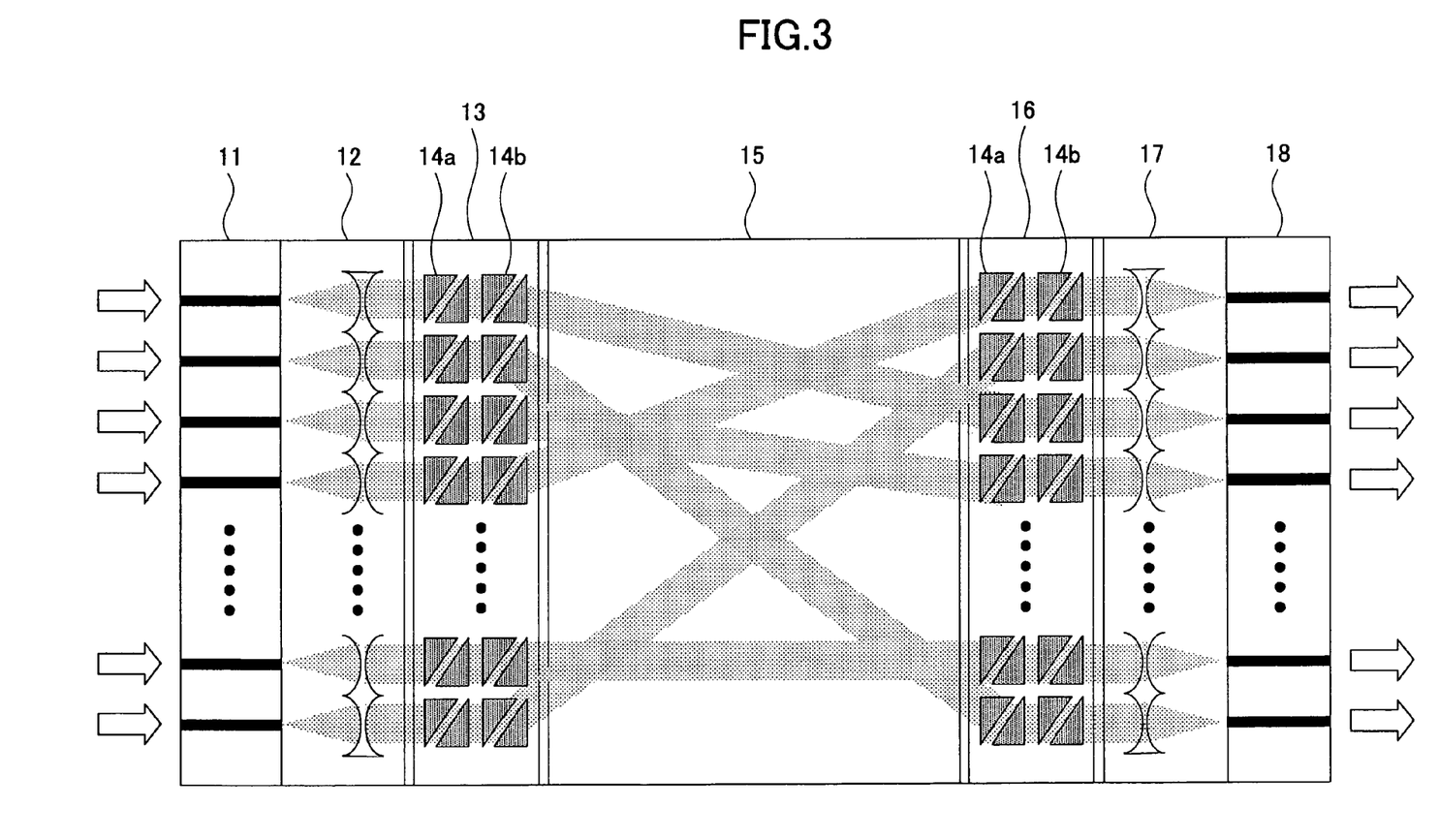
FIG. 3 is a diagram showing the composition of an optical matrix switch to which a capacitive load driving device in an embodiment of the invention is applied.

FIG. 3 shows the composition of an optical matrix switch to which a capacitive load driving device in an embodiment of the invention is applied.

In the optical matrix switch shown in FIG. 3, the light signals of a plurality of channels inputted from an optical fiber array 11 are converted into parallel light beams by a waveguide lens array 12 respectively, and they are supplied to a deflection element array 13.

Each of a plurality of deflection elements, which constitute the deflection element array 13, comprises two electro-optic effect devices 14a and 14b. For example, in each of the electro-optic effect devices 14a and 14b, electrodes are provided on the front and back surfaces of a ceramic PLZT (PLZT is the abbreviation of lead lanthanum zirconate titanate, which is also known as lanthanum-doped lead zirconate-lead titanate). When a voltage is applied between the electrodes, the refractive index of the PLZT is varied according to the applied voltage, so that the path of the light beam is changed and optical switching is carried out.

The light signals of the respective channels deflected by the deflection element array 13 are transmitted through a slab waveguide 15 to a deflection element array 16. The light signals are deflected by the electro-optic effect devices 14a and 14b contained in the deflection element array 16, and the deflected light signals are supplied to a waveguide lens array 17. The light signals are converted into parallel light beams by the waveguide lens array 17 respectively, and they are outputted from an optical fiber array 18.

Figure 4:
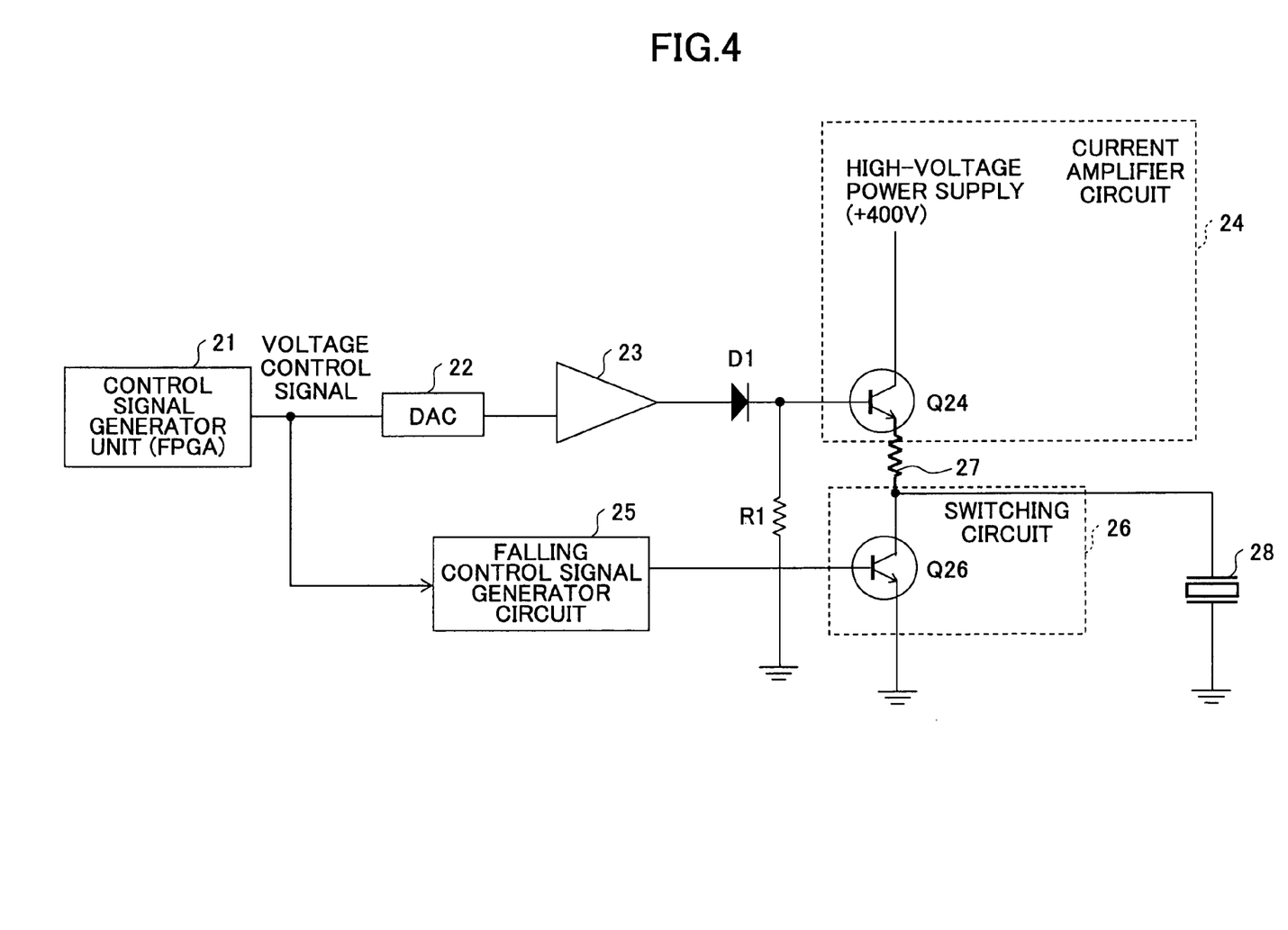
FIG. 4 is a diagram showing the composition of a capacitive load driving device in an embodiment of the invention.

FIG. 4 shows the composition of a capacitive load driving device in an embodiment of the invention.

In the capacitive load driving device of FIG. 4, a digital voltage control signal output from a control signal generator unit 21 (which is composed of a FPGA) is converted into an analog signal by a D/A converter (DAC) 22. A voltage of the analog voltage control signal is amplified by a voltage amplifier circuit 23. The amplified voltage control signal is supplied through a reverse-flow preventing diode D1 to a base of a pnp transistor Q24. This pnp transistor Q24 constitutes a current amplifier circuit 24.

The base of the pnp transistor Q24 is grounded via a resistor R1. This resistor R1 is provided for discharging the electric charge on the base of the pnp transistor Q24 when it is turned OFF.

Simultaneously, the digital voltage control signal output from the control signal generator unit 21 is supplied to a falling control signal generator circuit 25.

Figure 5:
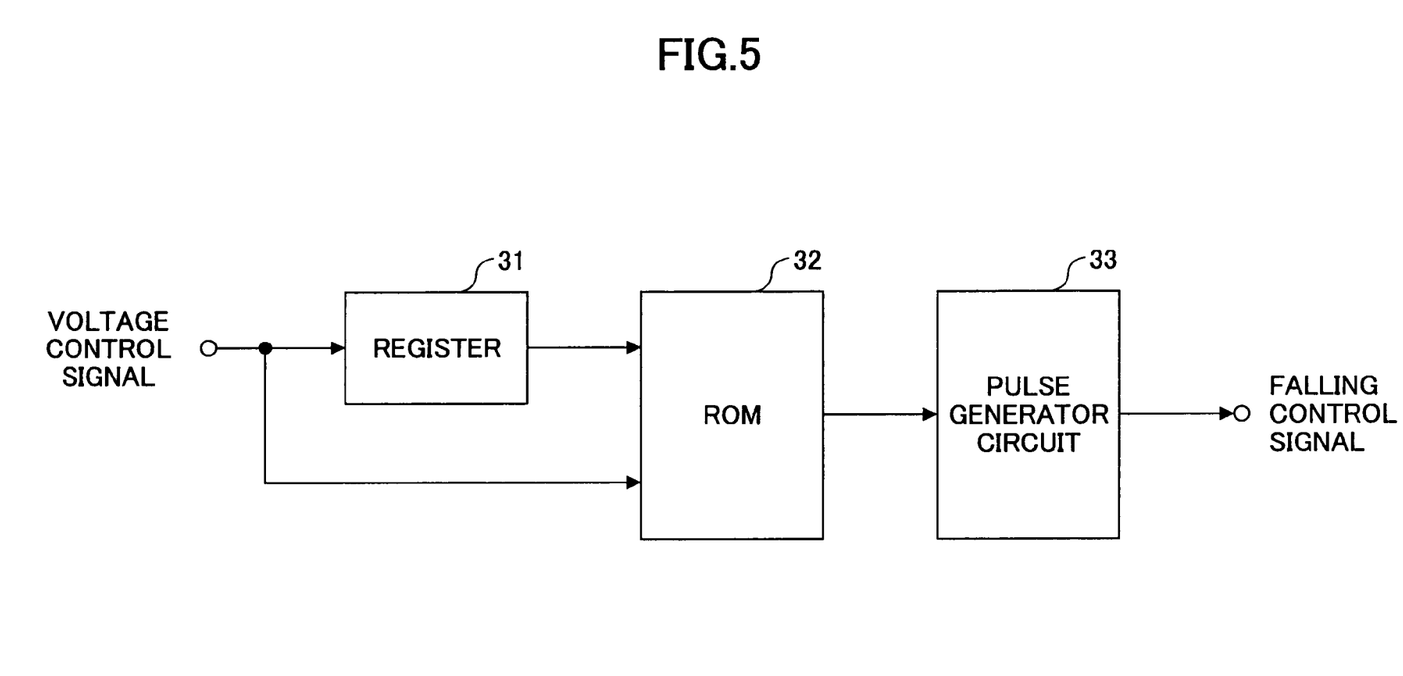
FIG. 5 is a diagram showing the composition of a falling control signal generator circuit in an embodiment of the invention.

FIG. 5 shows the composition of a control signal generator circuit in an embodiment of the shown.

As shown in FIG. 5, the falling control signal generator circuit 25 comprises a register 31, a ROM 32, and a pulse generator circuit 33. A previously supplied voltage control signal which is composed of a predetermined number of bits is stored in the register 31. A currently supplied voltage control signal which is composed of the predetermined number of bits is supplied to the ROM 32. Simultaneously, the previously supplied digital voltage control signal from the register 31 is also supplied to the ROM 32.

In the ROM 32, a table is stored in accordance with a difference between the values of the voltage control signals received. Specifically, when a difference Vd between the previously supplied voltage control signal value and the currently supplied voltage control signal value is less than a predetermined threshold value Vt (e.g., Vt=−50 V), the value 1 which is a specific value is stored in the table of the ROM 32 at a corresponding address (when Vd<Vt). The difference Vd indicates a width of falling of the voltage control signal output from the control signal generator unit 21. Otherwise, the value 0 is stored in the table of the ROM 32 (when Vd>=Vt).

Accordingly, when a width of falling from the previously supplied voltage control signal value to the currently supplied voltage control signal value exceeds 50V (i.e., when a width of falling of the voltage control signal exceeds 50V), the specific value 1 is read from the ROM 32, and the signal of the value 1 is supplied to the pulse generator circuit 33.

If the signal of the value 1 from the ROM 32 is supplied to the pulse generator circuit 33, the pulse generator circuit 33 is triggered so that it outputs a falling pulse (high-level pulse). For example, this falling pulse has a pulse width of 5 microseconds. The falling pulse output from the pulse generator circuit 33 is supplied to a base of a pnp transistor Q26 which constitutes the switching circuit 26 shown in FIG. 4.

In the capacitive load driving device of FIG. 4, a high voltage (for example, +400V) from a high-voltage power supply is supplied to the collector of the transistor Q24, and the emitter of the transistor Q24 is connected to the collector of the transistor Q24 to the collector of the transistor Q26 via a positive thermistor 27. This positive thermistor 27 has positive temperature characteristics.

The positive thermistor 27 is set up so that the resistance of the positive thermistor 27 at normal temperature is very low. The positive thermistor 27 is provided in order to prevent the flowing of a large current between the transistor Q24 and the transistor Q26 when the transistors Q24 and Q26 are turned on simultaneously.

One end of the capacitive load 28 (namely, one electrode of the electro-optic effect device) is connected to the junction point of the positive thermistor 27 and the collector of the transistor Q26, and the other end of the capacitive load 28 (namely, the other electrode of the electro-optic effect device) is grounded.

Figure 6:
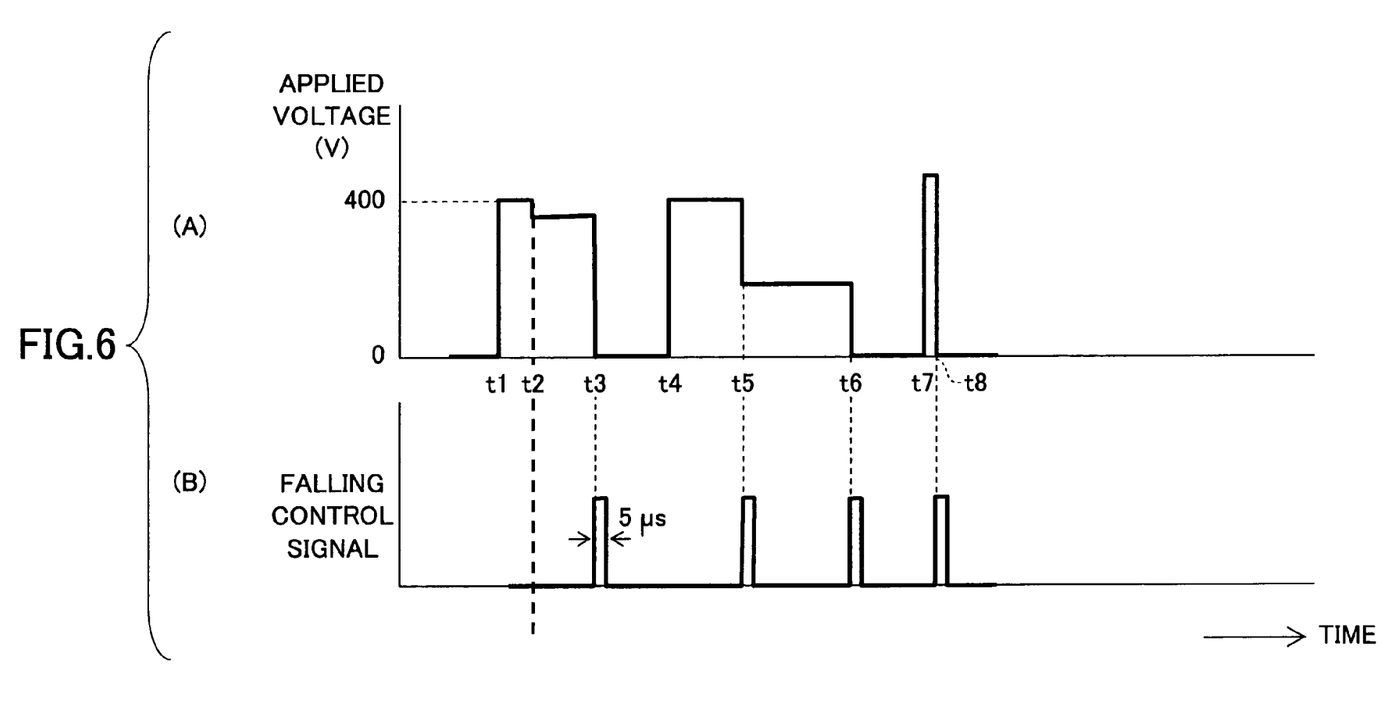
FIG. 6 is a diagram showing the waveform of the applied voltage of a capacitive load and the waveform of a falling control signal.

FIG. 6 shows the waveform of the applied voltage of the capacitive load and the waveform of the falling control signal.

Suppose the case in which the applied voltage having the waveform shown in FIG. 6(A) is supplied to the capacitive load 28 from the current voltage having the waveform shown in FIG. 6(A) is supplied to the capacitive load 28 from the current amplifier circuit 24 in accordance with the voltage control signal. In this case, the falling control signal generator circuit 25 outputs the falling control signal having the waveform shown in FIG. 6(B), to the switching circuit 26.

At the time instant t2, the applied voltage falls to 380V from 400V, and the width of falling (or the voltage difference) is less than 50V. Thus, no falling pulse is generated at this time. This is because the change of the applied voltage from 400V to 380V may be effected at high speed only by the operation of the transistor Q24 sufficiently, and it is not necessary to turn on the transistor Q26.

On the other hand, at each of the time instants t3, t5, t6 and t8, the width of falling of the applied voltage exceeds 50V. Thus, a falling pulse is generated at each time instant and the transistor Q26 is turned on, so that the waveform of the applied voltage to the capacitive load 28 changes at sufficiently high speed.

Figure 7:
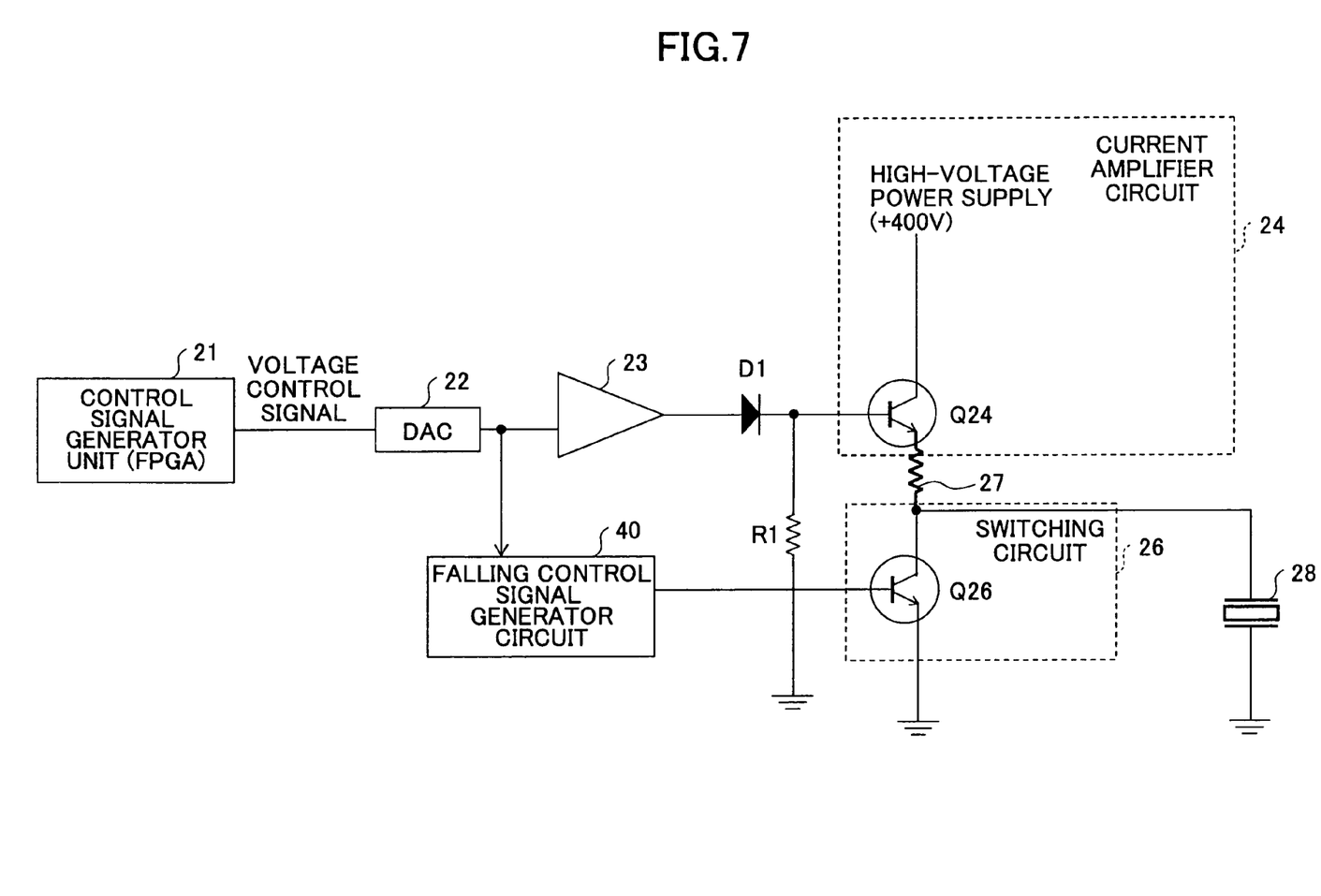
FIG. 7 is a diagram showing the composition of a capacitive load driving device in an embodiment of the invention.

FIG. 7 shows the composition of a capacitive load driving device in an embodiment of the invention.

In FIG. 7, the elements which are the same as corresponding elements in FIG. 4 are designated by the same reference numerals, and a description thereof will be omitted.

In the capacitive load driving device of FIG. 7, the digital voltage control signal output from the control signal generator unit 21 (which is composed of a FPGA) is converted into an analog signal by the D/A converter (DAC) 22. A voltage of the analog voltage control signal is amplified by the voltage amplifier circuit 23. The amplified voltage control signal is supplied through the reverse-flow preventing diode D1 to the base of the pnp transistor Q24 which constitutes the current amplifier circuit 24.

The base of the pnp transistor Q24 is grounded via the resistor R1 which is provided for discharging the electric charge on the base of the pnp transistor Q24 when it is turned OFF.

Simultaneously, the analog voltage control signal from the DAC 22 is supplied to a falling control signal generator circuit 40 in this embodiment.

Figure 8:
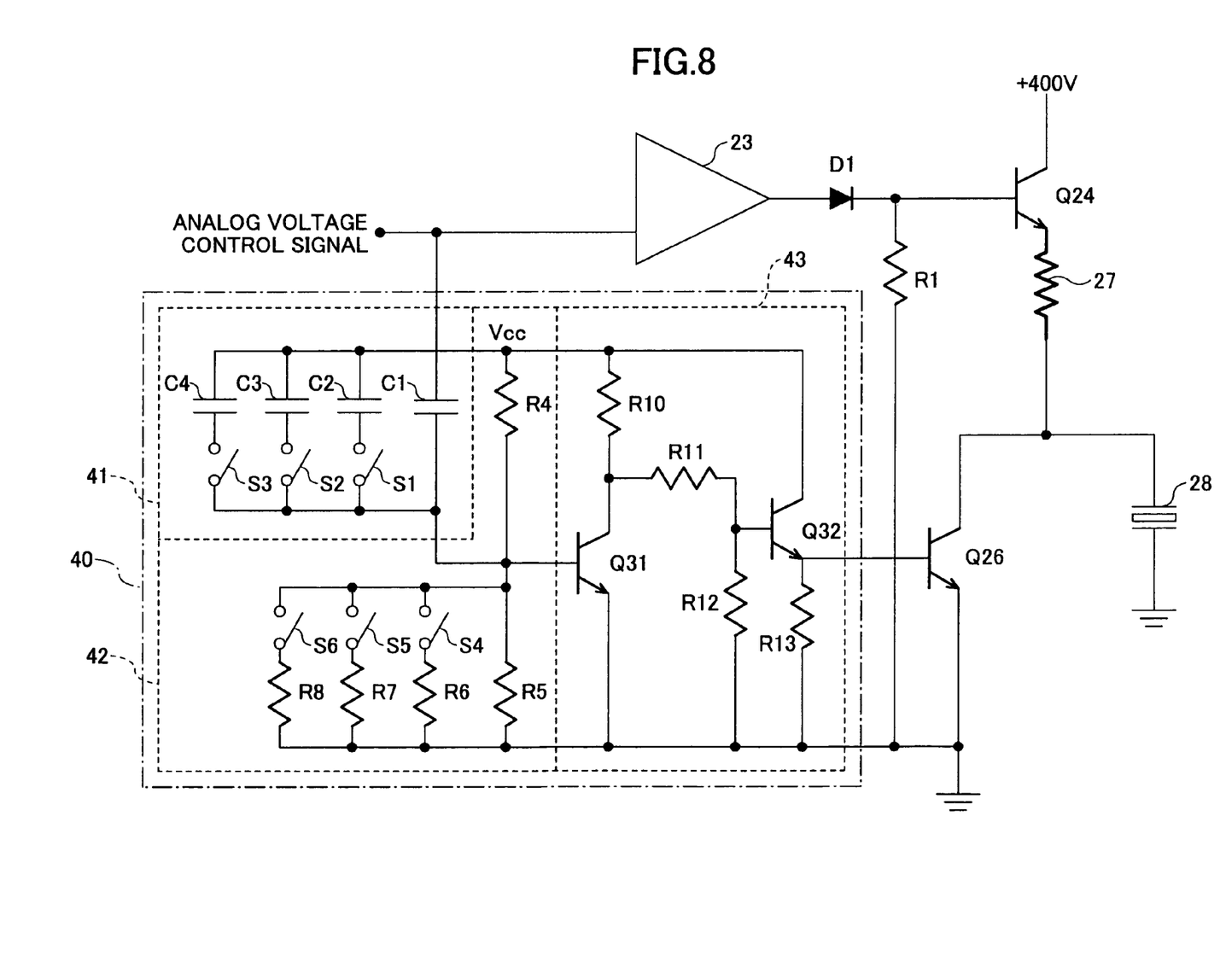
FIG. 8 is a diagram showing the composition of a falling control signal generator circuit in an embodiment of the invention.

FIG. 8 shows the composition of a control signal generator circuit in an embodiment of the invention.

The falling control signal generator circuit 40 of this embodiment comprises a differential circuit 41, a bias circuit 42, and a pulse generator circuit 43.

The differential circuit 41 includes a capacitor C1, a series connection circuit having a switch S1 and a capacitor C2 (connected in parallel with the capacitor C1), a series connection circuit having a switch S2 and a capacitor C3 (connected in parallel with the capacitor C1), and a series connection circuit having a switch S3 and a capacitor C4 (connected in parallel with the capacitor C1). The differential circuit 41 generates a differential waveform of the analog voltage control signal supplied from the DAC 22, and supplies it to the bias circuit 42.

The capacitors C2-C4 are provided for adjusting the capacitance of the capacitor C1 finely. At the time of initialization, control signals are supplied to the switches S1-S3 so that the switching ON/OFF of the switches S1-S3 in the differential circuit 41 may be set up.

Alternatively, a variable capacitance device (for example, a variable capacitance diode) which varies its electrostatic capacitance according to the applied voltage may be used as the differential circuit 41.

The bias circuit 42 includes resistors R4 and R5 which are connected in series between the power supply Vcc (voltage: +12V) and the ground, a series connection circuit having a switch S4 and a resistor R6 (which is connected in parallel with the resistor R5 and connected in series with the switch S4), a series connection circuit having a switch S5 and a resistor R7 (which is connected in parallel with the resistor R5 and connected in series with the switch S5), and a series connection circuit having a switch S6 and a resistor R8 (which is connected in parallel with the resistor R5 and connected in series with the switch S6). In the bias circuit 42, a divided voltage of the power supply voltage is generated, and a bias supplied to the base of an npn transistor Q31 in the pulse generator circuit 43 is determined.

The resistors R6-R8 are provided for adjusting the resistance of the resistor R5 finely. At the time of initialization, control signals are supplied to the switches S4-S6 so that the switching ON/OFF of the switches S4-S6 in the bias circuit 42 may be set up so as to change the divided voltage of the power supply voltage and adjust the bias (which is supplied to the base of the transistor Q31) finely.

In the pulse generator circuit 43, the collector of the transistor Q31 is connected to the power supply Vcc via a resistor R10, and the emitter of the transistor Q31 is grounded. The collector of the transistor Q31 is also grounded via resistors R11 and R12 which are connected in series). The junction point of the resistors R11 and R12 is connected to the base of an npn transistor Q32.

In the pulse generator circuit 43, the collector of the transistor Q32 is connected to the power supply Vcc, and the emitter of the transistor Q32 is grounded via a resistor R13. And the emitter of the transistor Q32 is connected to the base of the transistor Q26.

The transistor Q31 is turned OFF only when the differential waveform is turned into a negative polarity pulse at the time of falling of the voltage control signal so that the potential of the base of the transistor Q31 falls. The higher the bias voltage is set up, the shorter the period for which the transistor Q31 is OFF. Therefore, the bias supplied to the base of the transistor Q31 is set up so that the period for which the transistor Q31 is turned OFF by a negative polarity pulse of the differential waveform which appears when the width of falling from the previously supplied voltage control signal value to the currently supplied voltage control signal value exceeds 50V is set to 5 microseconds.

When the transistor Q31 is turned OFF, the transistor Q32 is turned ON so that a falling pulse (which is the falling control signal set to the high-level) is generated at the collector of the transistor Q32. This falling pulse is supplied to the base of the pnp transistor Q26 which constitutes the switching circuit 26 in the capacitive load driving device of FIG. 7.

Figure 9:
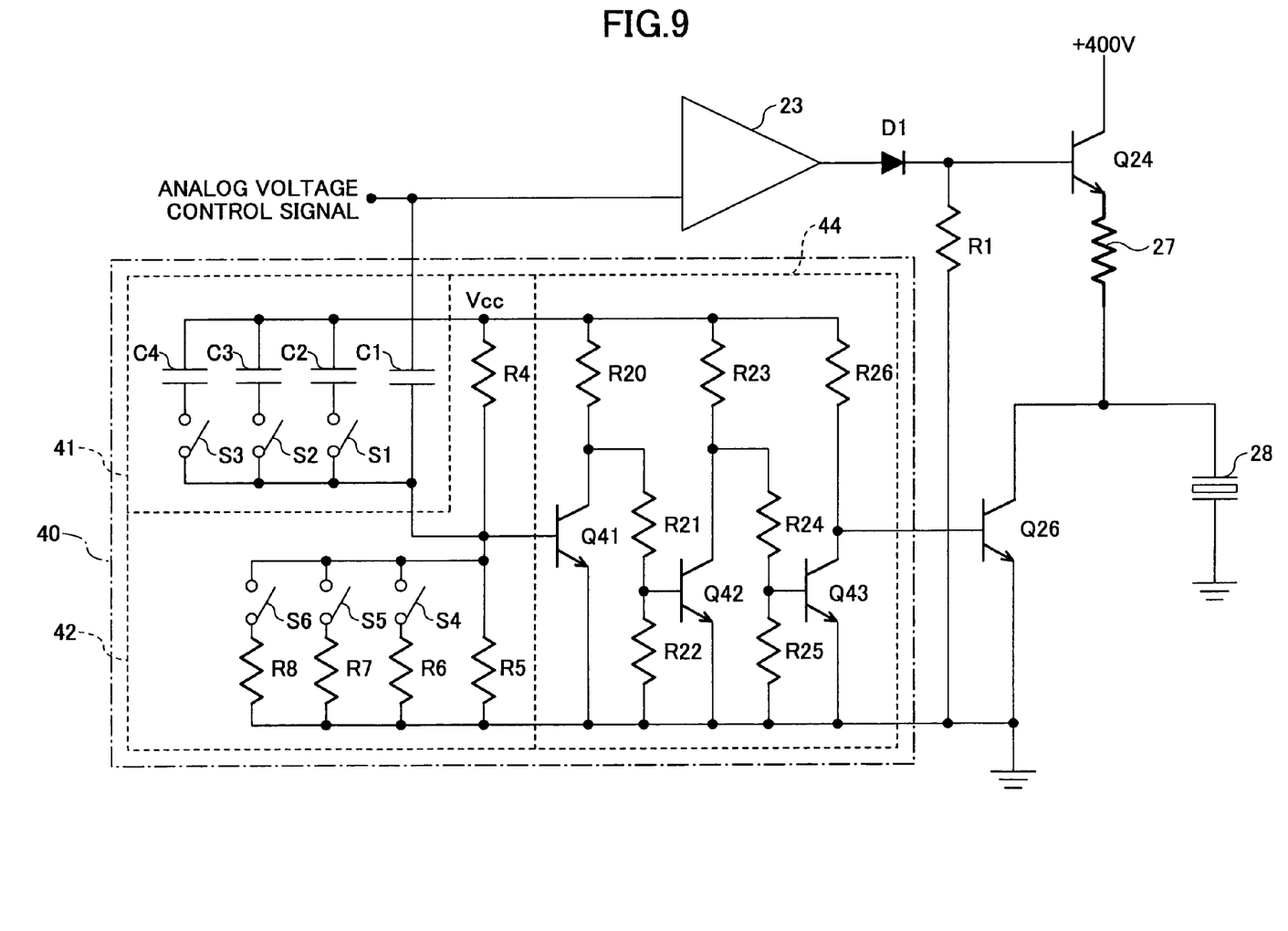
FIG. 9 is a diagram showing the composition of a modification of the falling control signal generator circuit.

FIG. 9 shows the composition of a modification of the control signal generator circuit 40 in an embodiment of the invention.

In FIG. 9, the elements which are the same as corresponding elements in FIG. 8 are designated by the same reference numerals, and a description thereof will be omitted.

As shown in FIG. 9, the control signal generator circuit 40 in this embodiment uses a pulse generator circuit 44 which is composed of a Schmitt trigger circuit, instead of the pulse generator circuit 43 shown in FIG. 8.

In the pulse generator circuit 44 of FIG. 9, the collector of the npn transistor Q41 is connected to the power supply Vcc via a resistor R20, and the emitter of the transistor Q41 is grounded. The collector of the transistor Q41 is grounded via resistors R21 and R22 which are connected in series and the junction point of the resistors R21 and R22 is connected to the base of the npn transistor Q42.

The collector of the npn transistor Q42 is connected to the power supply Vcc via a resistor R23, and the emitter of the transistor Q42 is grounded. The collector of the transistor Q42 is grounded via resistors R24 and R25 which are connected in series, and the junction point of the resistors R24 and R25 is connected to the base of the npn transistor Q43.

The collector of the transistor Q43 is connects to the power supply Vcc via a resistor R26, and the collector of the transistor Q43 is connected to the base of the transistor Q26, and the emitter of the transistor Q43 is grounded.

The transistors Q41 and Q42 have the emitters both grounded in common, and the transistors Q41 and Q42 constitute the Schmitt trigger circuit. Thereby, it is possible for the capacitive load driving device of this embodiment to realize steep rising and steep falling of the output trigger signal.

The transistor Q41 is turned OFF only when the differential waveform is turned into a negative polarity pulse at the time of falling of the voltage control signal so that the potential of the base of the transistor Q41. The higher the bias voltage is set up, the shorter the period for which the transistor Q41 is OFF. Therefore, the bias supplied to the base of the transistor Q41 is set up so that the period for which the transistor Q41 is turned OFF by a negative polarity pulse of the differential waveform which appears when the width of falling from the previously supplied voltage control signal value to the currently supplied voltage control signal value exceeds 50V is set to 5 microseconds.

When the transistor Q41 is turned OFF, the transistor Q42 is turned ON. And when the transistor Q42 is turned ON, the transistor Q43 is turned OFF so that a falling pulse (which is the falling control signal set to the high level) is generated at the collector of the transistor Q43 by the switching OFF of the transistor Q43. This falling pulse is supplied to the base of the pnp transistor Q26 which constitutes the switching circuit 26 in the capacitive load driving device shown in FIG. 7.

In the capacitive load driving device of FIG. 7, +400V from the high voltage power supply is supplied to the collector of the transistor Q24, and the emitter of the transistor Q24 is connected to the collector of the transistor Q26 via the positive thermistor 27 which has the positive temperature characteristics.

The positive thermistor 27 is set up such that the resistance of the positive thermistor 27 in normal temperature is very low. The positive thermistor 27 is provided in order to prevent a large amount of current from flowing through the transistors Q24 and Q25 when the transistors Q24 and Q25 are turned ON simultaneously.

One end of the capacitive load 28 (or, one electrode of the electro-optic effect device) is connected to the junction point of the positive thermistor 27 and the collector of the transistor Q26, and the other end of the capacitive load 28 (that is, the other electrode of the electro-optic effect device) is grounded.

When the voltage having the waveform as shown in FIG. 6(A) is supplied from the current amplifier circuit 24 to the capacitive load 28 by the voltage control signal, the falling control signal generator circuit 25 generates the falling pulse as shown in FIG. 6(B).

At the time instant t2, the applied voltage falls to 380V from 400V, and the width of falling (or the voltage difference) is less than 50V. Thus, no falling pulse is generated at this time. This is because the change of the applied voltage from 400V to 380V may be effected at high speed enough only by the operation of the transistor Q24, and it is not necessary to turn on the transistor Q26.

On the other hand, at each of the time instants t3, t5, t6 and t8, the width of falling of the applied voltage exceeds 50V. Thus, a falling pulse is generated at each time instant, and the transistor Q26 is turned on, so that the waveform of the applied voltage to the capacitive load 28 changes at sufficiently high speed.

Alternatively, the capacitive load which is driven by the capacitive load driving device of the invention may be any other capacitive load, such as a piezoelectric element, different from the electro-optic effect device as in the above-described embodiment.

The control signal generator unit 21 in the above-described embodiment is equivalent to a voltage control signal generator unit in the claims. The voltage amplifier circuit 23 in the above-described embodiment is equivalent to a voltage amplifier unit in the claims. The current amplifier circuit 24 in the above-described embodiment is equivalent to a current amplifier unit in the claims.

The falling control signal generator circuits 25 and 40 in the above-described embodiment are equivalent to a falling control signal generator unit in the claims. The switching circuit 26 in the above-described embodiment is equivalent to a switching unit in the claims.

The ROM 32 in the above-described embodiment is equivalent to a table unit in the claims. The pulse generator circuit 33 in the above-described embodiment is equivalent to a pulse generator unit in the claims. The differential circuit 41 in the above-described embodiment is equivalent to a differential unit in the claims.

The transistors Q31 and Q32 in the above-described embodiment are equivalent to first and second transistors in the claims. The capacitors C2, C3, C4, and the switches S1, S2, S3 in the above-described embodiment are equivalent to a time-constant adjusting unit in the claims. The resistors R6, R7, R8, and the switches S4, S5, S6 in the above-described embodiment are equivalent to a bias adjustment unit in the claims.

The present invention is not limited to the specifically disclosed embodiment, and variations and modifications may be made without departing from the scope of the present invention.

What is claimed is:

1. A capacitive load driving device which applies a multi-level voltage to a capacitive load to drive the capacitive load, comprising:
    a voltage control signal generator unit to generate a voltage control signal;
    a voltage amplifier unit to amplify a voltage of the voltage control signal;
    a current amplifier unit to amplify a current of an output of the voltage amplifier unit to perform charging of the capacitive load;
    a falling control signal generator unit to generate a falling pulse with a predetermined pulse width when a width of falling of the voltage control signal exceeds a predetermined value; and
    a switching unit to perform discharging of the capacitive load in response to the falling pulse received from the falling control signal generator unit,
    wherein the falling control signal generator unit comprises:
    table unit to access a table with a digital value of a previously supplied voltage control signal and a digital value of a currently supplied voltage control signal, and read a specific value from the table when a width of falling from the previously supplied voltage control signal value to the currently supplied voltage control signal value exceeds a predetermined value; and
    a pulse generator unit to generate a falling pulse when the specific value is read from the table.

2. The capacitive load driving device according to claim 1, wherein the capacitive load is an electro-optic effect device.

* * * * *

UNITED STATES PATENT AND TRADEMARK OFFICE
CERTIFICATE OF CORRECTION

PATENT NO. : 7,598,781 B2 Page 1 of 1
APPLICATION NO. : 11/878792
DATED : October 6, 2009
INVENTOR(S) : Yutaka Takita It is certified that error appears in the above-identified patent and that said Letters Patent is hereby corrected as shown below:

Title Page; item (56);

First Page, Column 2 (Other Publications), Line 3, change "NY," to --NJ,--.

First Page, Column 2 (Other Publications), Line 6, change "PLTZ" to --PLZT--.

Signed and Sealed this

Twelfth Day of January, 2010

David J. Kappos
*Director of the United States Patent and Trademark Office*